United States Patent
Oh et al.

(10) Patent No.: US 9,655,243 B2
(45) Date of Patent: May 16, 2017

(54) DISPLAY PANEL AND MOTHER PANEL FOR MANUFACTURING THE SAME

(71) Applicant: Samsung Display Co., Ltd., Yongin (KR)

(72) Inventors: Byungchun Oh, Yongin (KR); Sucheol Gong, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 50 days.

(21) Appl. No.: 14/588,856

(22) Filed: Jan. 2, 2015

(65) Prior Publication Data

US 2016/0037639 A1  Feb. 4, 2016

(30) Foreign Application Priority Data

Aug. 4, 2014 (KR) ..................... 10-2014-0099975

(51) Int. Cl.
*H05K 1/14* (2006.01)
*H01L 51/52* (2006.01)

(52) U.S. Cl.
CPC ......... *H05K 1/144* (2013.01); *H01L 51/5246* (2013.01); *H01L 2251/566* (2013.01); *H05K 2201/042* (2013.01); *H05K 2201/10128* (2013.01)

(58) Field of Classification Search
CPC ... H01L 21/78; H01L 21/304; H01L 21/6836; H01L 23/544; H01L 2223/54486; H01L 2924/0002; H01L 2221/6834; H01L 2223/54433; H01L 2221/68327; H05K 1/14; H05K 1/141; H05K 1/142; H05K 1/145
See application file for complete search history.

(56) References Cited

U.S. PATENT DOCUMENTS

| | | | |
|---|---|---|---|
| 2003/0169392 A1 | 9/2003 | Park et al. | |
| 2007/0176185 A1* | 8/2007 | Lee | H01L 51/5237 257/79 |
| 2008/0138653 A1* | 6/2008 | Lee | C03C 8/24 428/690 |
| 2010/0117067 A1 | 5/2010 | Sin et al. | |
| 2010/0325392 A1* | 12/2010 | Kim | 712/33 |
| 2011/0234967 A1 | 9/2011 | Kim | |
| 2011/0303943 A1 | 12/2011 | Lee et al. | |
| 2014/0062290 A1 | 3/2014 | Kim | |

FOREIGN PATENT DOCUMENTS

| | | |
|---|---|---|
| KR | 10-2003-0072741 | 9/2003 |
| KR | 10-2005-0068294 | 7/2005 |
| KR | 10-0711882 | 4/2007 |
| KR | 10-2010-0052895 | 5/2010 |
| KR | 10-2011-0106735 | 9/2011 |
| KR | 10-2011-0135625 | 12/2011 |
| KR | 10-2014-0031003 | 3/2014 |

* cited by examiner

*Primary Examiner* — Julio J Maldonado
*Assistant Examiner* — Stanetta Isaac
(74) *Attorney, Agent, or Firm* — H.C. Park & Associates, PLC

(57) ABSTRACT

A mother panel including second sealing members which are disposed at an outer side of each of first sealing members which surround display devices between a first mother substrate and a second mother substrate and have a plurality of unit patterns whose width in a second direction which is perpendicular to a first direction which is a direction away from each of the first sealing members decreases along the first direction.

16 Claims, 14 Drawing Sheets

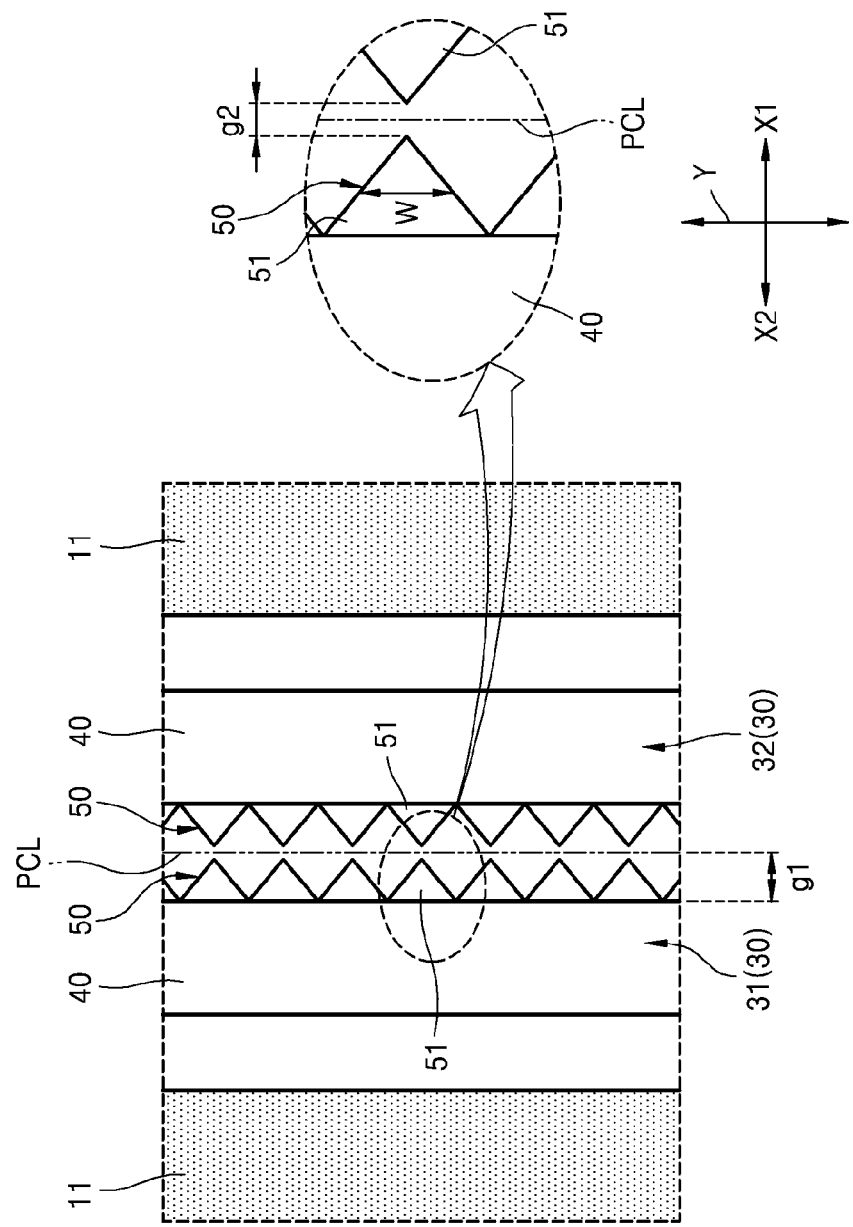

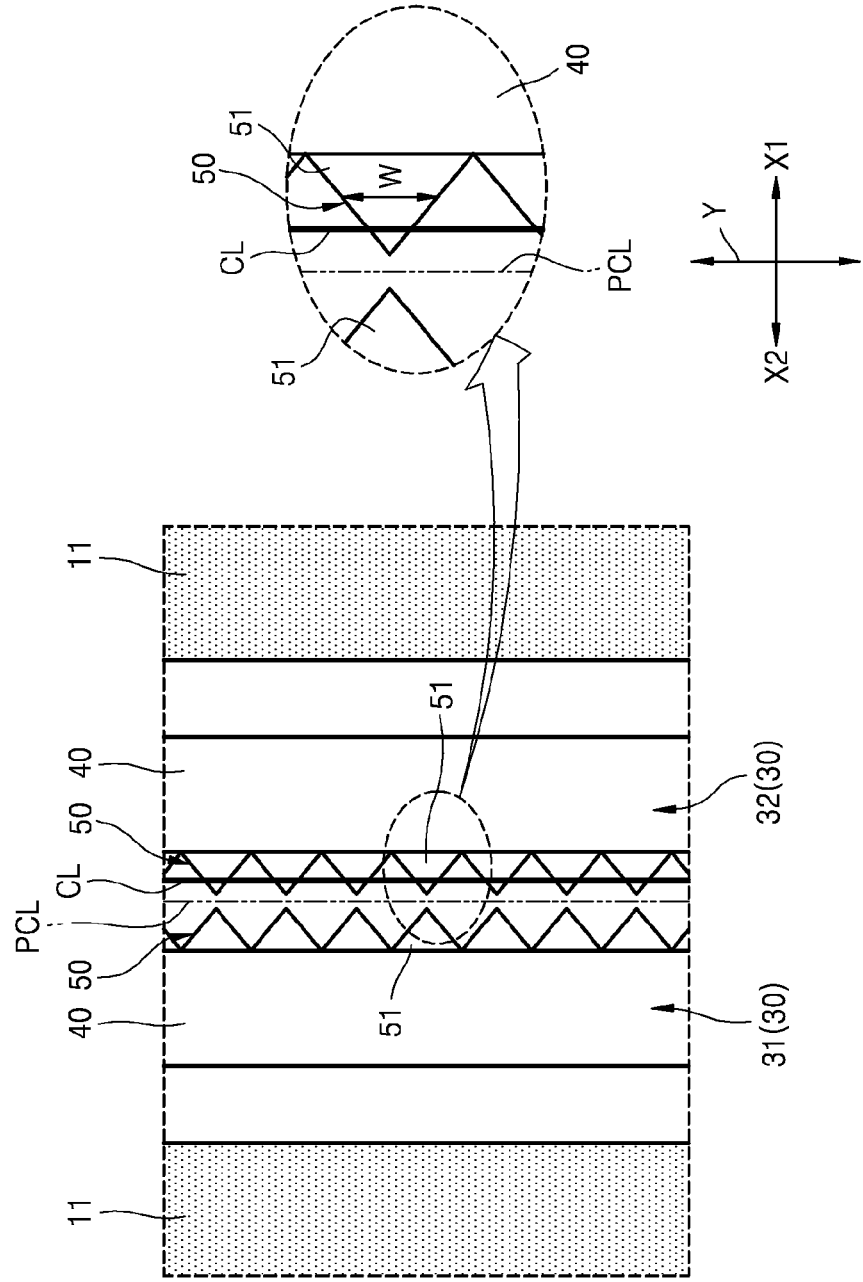

DISPLAY PANEL AND MOTHER PANEL FOR MANUFACTURING THE SAME

CROSS-REFERENCE TO RELATED APPLICATION

This application claims the priority from and benefit of Korean Patent Application No. 10-2014-0099975, filed on Aug. 4, 2014, which is hereby incorporated by reference for all purposes as if fully set forth herein.

BACKGROUND

Field

Exemplary embodiments of the present invention relate to a display panel and a mother panel for manufacturing the same.

Discussion of the Background

Display panels such as liquid crystal displays (LCD), organic light emitting diode (OLED) displays, plasma display panels (PDP), and electrophoretic displays (EPD) are manufactured by a variety of processes.

The manufacturing processes may include a process of bonding a first mother substrate and a second mother substrate by melting and hardening a sealing portion disposed between the first and second mother substrates and a cutting process of separating a mother panel including the first and second mother substrates which are bonded into plural display panels.

The display panels separated by the cutting process include a first substrate and a second substrate facing each other, a display device formed on the first substrate, and a sealing portion surrounding the display device. In view of errors or damages which occur during the cutting process, a predetermined cutting margin exists between end portions of the sealing portion and the substrates.

Meanwhile, regions other than the pixel portion where the display device is formed among the whole region of the display panel is called dead space. The sealing portion is disposed in the dead space.

The dead space limits the proportion of a region occupied by the pixel portion in the whole region of the panel, and therefore, attempts to reduce the dead space are continuously being made.

As an example of attempts to reduce the dead space, decreasing the sealing portion in width may be considered. However, when the width of the sealing portion decreases, bonding performance between the first and second substrates may be reduced.

As another example of attempts to reduce the dead space, decreasing the cutting margin which is a distance between the end portions of the sealing portion and the substrates may be considered. However, when the cutting margin decreases, performance of the sealing portion may deteriorate or a cutting error due to irregular cutting lines may arise during the cutting process.

The above information disclosed in this background section is only for enhancement of understanding of the background of the inventive concept, and, therefore, it may contain information that does not form the prior art that is already known in this country to a person of ordinary skill in the art.

SUMMARY

Exemplary embodiments of the present invention include a display panel which may improve bonding performance of a sealing portion and prevent a cutting error in a cutting process.

Exemplary embodiments of the present invention include a mother panel for manufacturing the display panel.

Additional aspects will be set forth in part in the description which follows and, in part, will be apparent from the description, or may be learned by practice of the presented embodiments.

According to exemplary embodiments of the present invention, a mother panel includes a first mother substrate; a second mother substrate facing the first mother substrate; display devices disposed between the first mother substrate and the second mother substrate, the display devices being separated from each other; first sealing members disposed between the first mother substrate and the second mother substrate and surrounding each of the display devices; and second sealing members disposed between the first mother substrate and the second mother substrate and an outer side of the first sealing members, the second sealing members comprising unit patterns, wherein a width of each unit pattern in a second direction perpendicular to a first direction decreases along the first direction which is a direction away from each of the first sealing members.

According to exemplary embodiments of the present invention, a display panel includes a first substrate; a second substrate facing the first substrate; a display device disposed between the first substrate and the second substrate; a first sealing member disposed between the first substrate and the second substrate surrounding the display device; and a second sealing member disposed between the first substrate and the second substrate and at an outer side of the first sealing member, the second sealing member comprising unit patterns, wherein a width of each unit pattern in a second direction perpendicular to a first direction decreases along the first direction which is a direction away from each of the first sealing members.

These general and specific embodiments may be implemented by using a system, a method, a computer program, or a combination thereof.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

These and/or other aspects will become apparent and more readily appreciated from the following description of the embodiments, taken in conjunction with the accompanying drawings.

FIG. 2A is a view in which part A of FIG. 1A is enlarged.

FIGS. 5A and 5B are plan views that schematically illustrate a portion of the mother panel for display panels when the cutting lines are off the planned cutting lines as in FIGS. 4A and 4B.

DETAILED DESCRIPTION OF THE ILLUSTRATED EMBODIMENTS

Figure 1A:
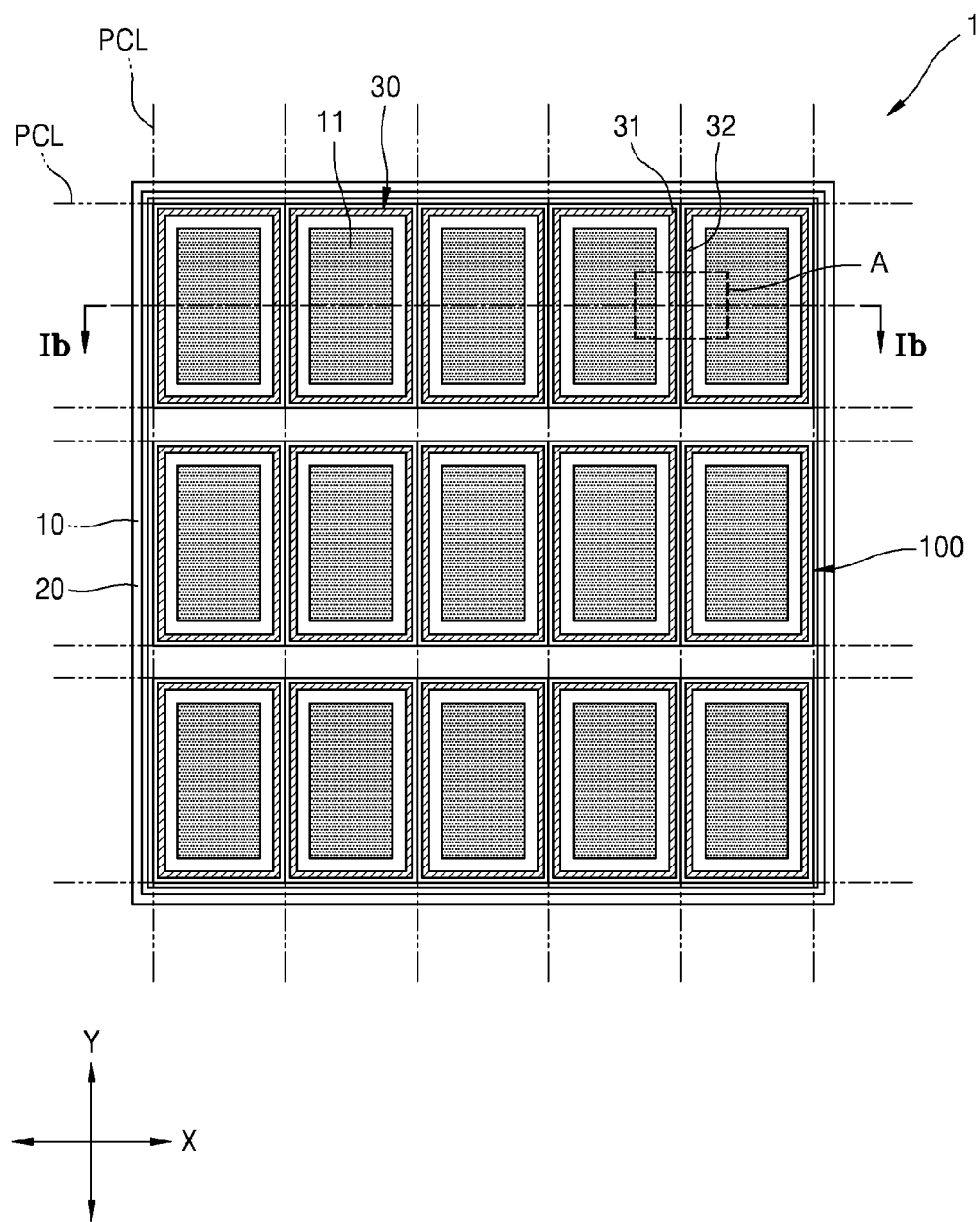
FIG. 1A is a schematic plan view of a mother panel according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1B:
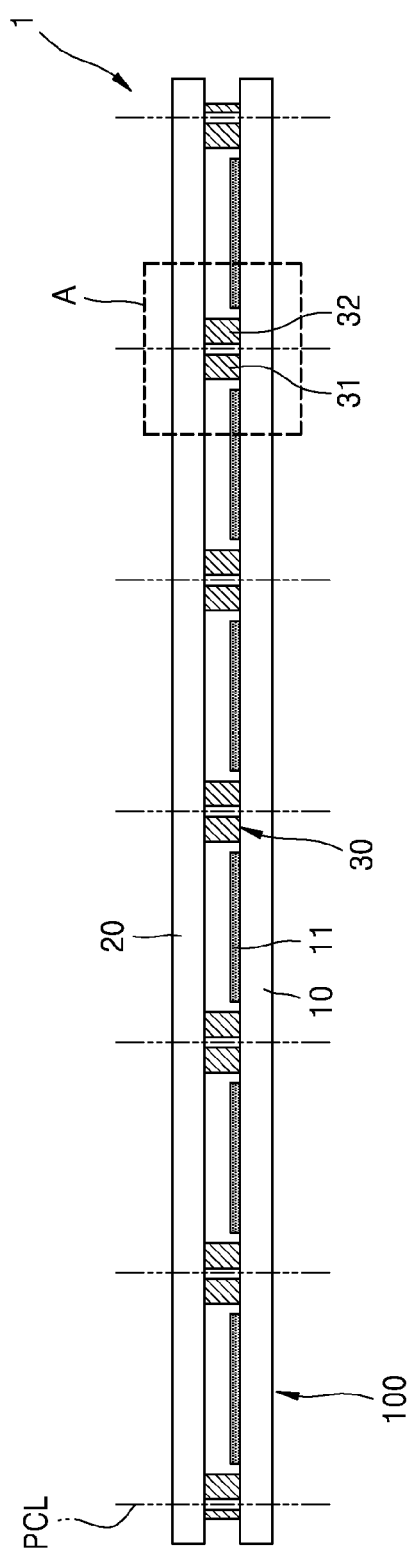
FIG. 1B is a cross-sectional view in which the mother panel of FIG. 1A is cut along Ib-Ib line.

FIG. 1A is a schematic plan view of a mother panel 1 for manufacturing display panels 100 according to an exemplary embodiment of the present invention, and FIG. 1B is a cross-sectional view along Ib-Ib line of the mother panel 1 in FIG. 1A.

Referring to FIGS. 1A and 1B, the mother panel 1 for manufacturing the display panels 100 according to the present embodiment includes a first mother substrate 10, a second mother substrate 20 which is disposed to face the first mother substrate 10, and sealing portions 30 which are disposed between the first mother substrate 10 and the second mother substrate 20 to bond the first mother substrate 10 and the second mother substrate 20.

The first mother substrate 10 may be made of various materials. For example, the first mother substrate 10 may be a glass substrate, a metal substrate, or a plastic substrate with flexibility.

Display devices 11 are disposed on the first mother substrate 10. The display devices 11 may be organic light emitting diodes (OLED). While the OLEDs are not shown in the diagram, the OLEDs may include an anode, a cathode, and an emission layer between the anode and the cathode. Display devices 11 according to exemplary embodiments of the present invention may also be liquid crystal display devices or electrophoretic display devices.

The second mother substrate 20 may be made of a transparent material. An image formed by the display devices 11 may be transmitted through the transparent second mother substrate 20. The second mother substrate 20 may be a glass substrate.

The sealing portions 30 surround the display devices 11 and are disposed between the first mother substrate 10 and the second mother substrate 20. The sealing portions 30 form closed loops. The sealing portions 30 bond the first mother substrate 10 and the second mother substrate 20 to seal the inner spaces between the first mother substrate 10 and the second mother substrate 20. A moisture absorbent or a filler may be located in the inner spaces between the first mother substrate 10 and the second mother substrate 20.

The sealing portions 30 may include an inorganic compound. For example, the sealing portions 30 may include a glass frit. The first mother substrate 10 and the second mother substrate 20 may be stably bonded and sealed by radiating a laser beam on the sealing portions 30, and melting (or firing) and hardening the sealing portions 30 accordingly.

The first mother substrate 10 and the second mother substrate 20 which are bonded and sealed by the sealing portions 30 may be divided into unit of cells corresponding to the display devices 11. For this, the first mother substrate 10 and the second mother substrate 20 may be cut along planned cutting lines (PCL) located between the adjacent sealing portions 30. The PCLs include PCLs which are formed along the horizontal direction and PCLs which are formed along the vertical direction.

The mother panel 1 may be separated into the display panels 100 by cutting the first and second mother substrates 10 and 20 along the PCLs.

Figure 2B:
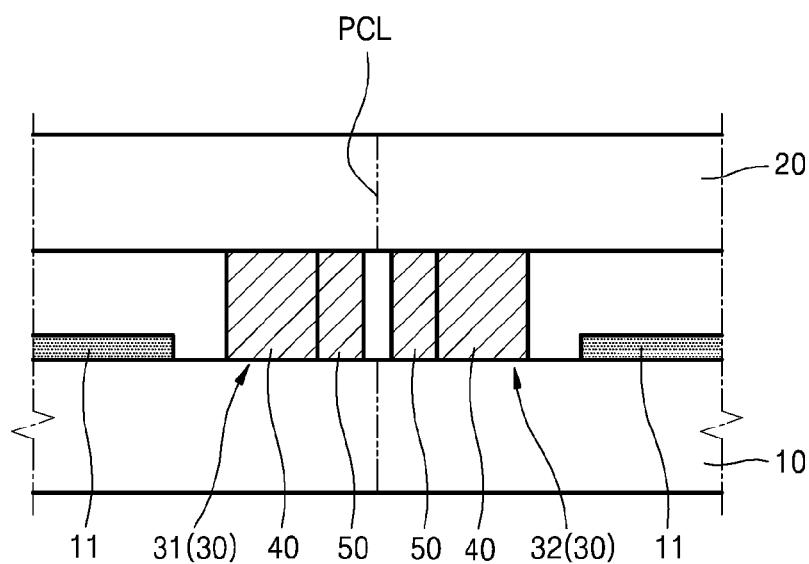
FIG. 2B is a view in which part A of FIG. 1B is enlarged.
Figure 3A:
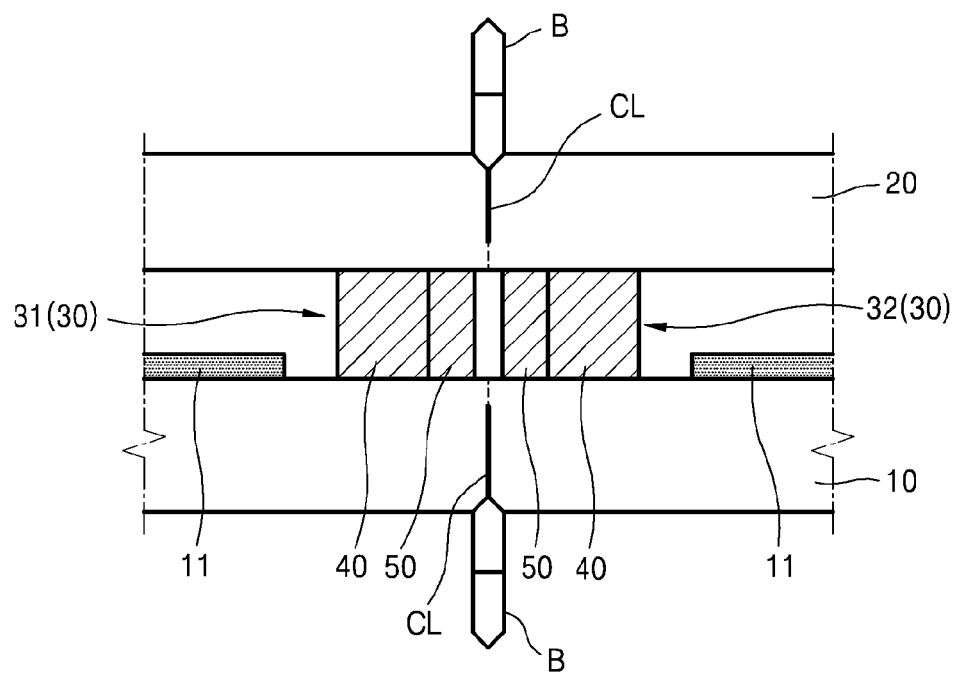
FIGS. 3A and 3B are schematic views of a process of cutting a first mother substrate and a second mother substrate which are shown in FIG. 2B.
Figure 3B:
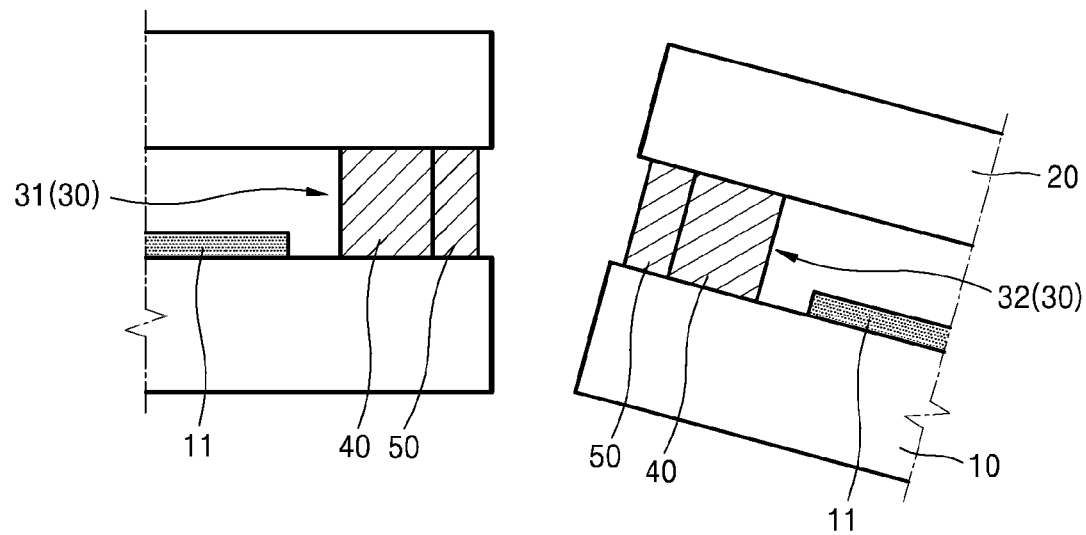

FIG. 2A is a view in which part A of FIG. 1A is enlarged, and FIG. 2B is a view in which part A of FIG. 1B is enlarged. FIGS. 3A and 3B are schematic views of a process of cutting the first and second mother substrates 10 and 20 which are shown in FIG. 2B.

Referring to FIGS. 2A and 2B, a first sealing portion 31 and an adjacent second sealing portion 32 are formed to surround the adjacent display devices 11. Each of the adjacent first and second sealing portions 31 and 32 includes a first sealing member 40 and a second sealing member 50.

The first sealing member 40 forms a closed loop to surround the display device 11, and bonds and seals the first mother substrate 10 and the second mother substrate 20.

The first sealing member 40 may include an inorganic compound. For example, the first sealing member 40 may include a glass frit. Penetration of moisture or oxygen into a space where the display device 11 is formed may be prevented by using the glass frit as a material of the first sealing member 40.

As shown in FIG. 2A, the display device 11 is disposed on an inner side of the first sealing member 40 and the second sealing member 50 is disposed on an outer side of the first sealing member 40.

The second sealing member 50 is disposed at an outer side of the first sealing member 40 and is disposed at an inner side of the PCL. That is, the second sealing member 50 is disposed between the PCL and the first sealing member 40.

In the process of cutting the first and second mother substrates 10 and 20, the second sealing member 50 supports the first and second mother substrates 10 and 20. Thus, the second sealing member 50 may prevent cutting lines (CL) from being irregularly formed in a thickness direction of the first and second mother substrates 10 and 20.

Also, the second sealing member 50 may prevent vibration applied to the first and second mother substrates 10 and 20 in the process of cutting the first and second mother substrates 10 and 20 from directly being delivered to the first sealing member 40. Thus, the second sealing member 50 may prevent reduction in the bonding strength between the first sealing member 40 and the first and second mother substrates 10 and 20, which may be useful in a cutting process by friction such as cutting with blades.

The second sealing member 50, along with the first sealing member 40, bonds the first mother substrate 10 and the second mother substrate 20. The second sealing member 50 may improve the bonding between the first and second mother substrates 10 and 20 by increasing contact areas between the first and second mother substrates 10 and 20 and the sealing portions 30.

The second sealing member 50 may include an inorganic compound. For example, the second sealing member 50 may include a glass frit. The second sealing member 50 may be of the same material as the first sealing member 40. By forming the second sealing member 50 and the first sealing member 40 with the same material, the second sealing member 50 may be easily formed without adding an extra process such as a process of forming a stiffener of a different material.

In order to bond the first and second mother substrates 10 and 20, the laser beam is irradiated on the second sealing member 50 which is an inorganic compound, and the second sealing member 50 is melted and hardened accordingly. In the process of hardening the second sealing member 50 which is an inorganic compound, the hardness of regions which are in contact with the second sealing member 50, among the first and second mother substrates 10 and 20, increases as compared to the surrounding regions. The increase in the hardness of some areas among the first and second mother substrates 10 and 20 may cause a cutting error during the cutting process of the first and second mother substrates 10 and 20. For example, when the CLs of the first and second mother substrates 10 and 20 are formed to overlap the second sealing member 50, the CLs may not be extended to regions of higher hardness and are extended along regions of relatively lower hardness. Thus, the CLs may not be extended in an intended through-thickness direction of the first and second mother substrates 10 and 20. While such phenomenon is less problematic in the cutting process if a width the second sealing member 50 and the CLs overlap is small, the cutting error may occur if the width the second sealing member 50 and the CLs overlap become greater. For example, if the width at which the CLs overlap the second sealing member 50 becomes greater than the width the CLs that do not overlap the second sealing member 50, a cutting error may occur.

Thus, for a normal cutting where the CLs are formed in the intended thickness direction, the overlap between the CLs and the second sealing member 50 should to be minimized to prevent a cutting error from occurring.

In order to reduce dead space of the display panels 100, gaps (g1) between the first sealing member 40 and the PCL may be limited to a predetermined range. For example, the gaps (g1) between the first sealing member 40 and the PCL may be equal to or less than about 100 um.

According to the present exemplary embodiment, the second sealing member 50 has a structure where the second sealing member 50 may minimize the cutting error in the cutting process while increasing contact areas with the first and second mother substrates 10 and 20 within regions of the limited gaps (g1) between the first sealing member 40 and the PCL as described above.

For this, the second sealing member 50 may have unit patterns 51. Along a first direction X1 which is a direction away from the first sealing member 40, each of the unit patterns 51 has a decreasing width W in a second direction Y which is perpendicular to the first direction X1 (which will be referred to as "width W" hereinafter), as shown in FIG. 2A. The unit patterns 51 may be arranged along the second direction Y. Here, the first sealing member 40 is a criterion for a first direction, and therefore the first direction may vary depending on the location of the first sealing member 40. For example, while the first direction of the first sealing portion 31 is X1, the first direction of the second sealing portion 32 may be X2. However, the first direction will refer to the first direction X1 of the first sealing portion 31 hereinafter for convenience of explanation.

The unit patterns 51 have a decreasing width W along the first direction X1 and an increasing width W along the opposite direction X2 to the first direction X1. The PCL is formed at an outer side of the unit patterns 51. Accordingly, the first direction X1 may mean a direction which becomes closer to the PCL. The unit patterns 51 have a decreasing width W as the unit patterns 51 become closer to the PCL and an increasing width W as the unit patterns 51 extends further away from the PCL. For example, the unit patterns 51 may be triangular in shape, such that the unit patterns 51 collectively form a saw-tooth pattern.

The cutting error may be reduced because the unit patterns 51 have a narrow width W in a region closer to the PCL. At the same time, a predetermined contact area with the first and second mother substrates 10 and 20 may be secured because the unit patterns 51 have a wide width W in a region further away from the PCL.

Hereinafter, the process of cutting the first and second mother substrates 10 and 20 will be roughly explained, and features of the unit patterns 51 in the cutting process will be described. While the explanations will be focused on a cutting method using blades B for convenience of explanation, a cutting method is not limited thereto. For example, a cutting method using laser may be used as the cutting process.

The process of cutting the first and second mother substrates 10 and 20 may include a process of scribing by blades B and an process of breaking in which a predetermined force is applied to a first substrate 110 and a second substrate 120, which are later explained and shown in FIG. 10A.

Referring to FIG. 3A, the blade B moves along the PCL in a direction which is parallel to a plane of the first mother substrate 10 while the blade B is in contact with the first mother substrate 10, thereby forming the CL on the first mother substrate 10. Also, the blade B moves along the PCL in a direction which is parallel to a plane of the second mother substrate 20 while the blade B is in contact with the second mother substrate 20, thereby forming the CL on the second mother substrate 20. The CLs formed by the blades B may be formed in a part of the first and second mother substrates 10 and 20 in a through-thickness direction of the first and second mother substrates 10 and 20.

Where the CLs are partly formed in the first and second mother substrates 10 and 20 in their respective thickness directions, if a predetermined force is applied to at least one of the first and second mother substrates 10 and 20, the CLs may be extended to surfaces of the first and second mother substrates 10 and 20 as denoted by dotted lines in FIG. 3A. Thus, the first and second mother substrates 10 and 20 may be cut as shown in FIG. 3B.

However, the blades B may not move accurately along the PCLs in an actual manufacturing operation due to various factors, for example, control accuracy of the blades B. Accordingly, the CLs formed by the blades B may not be consistent with the PCLs.

Figure 4A:
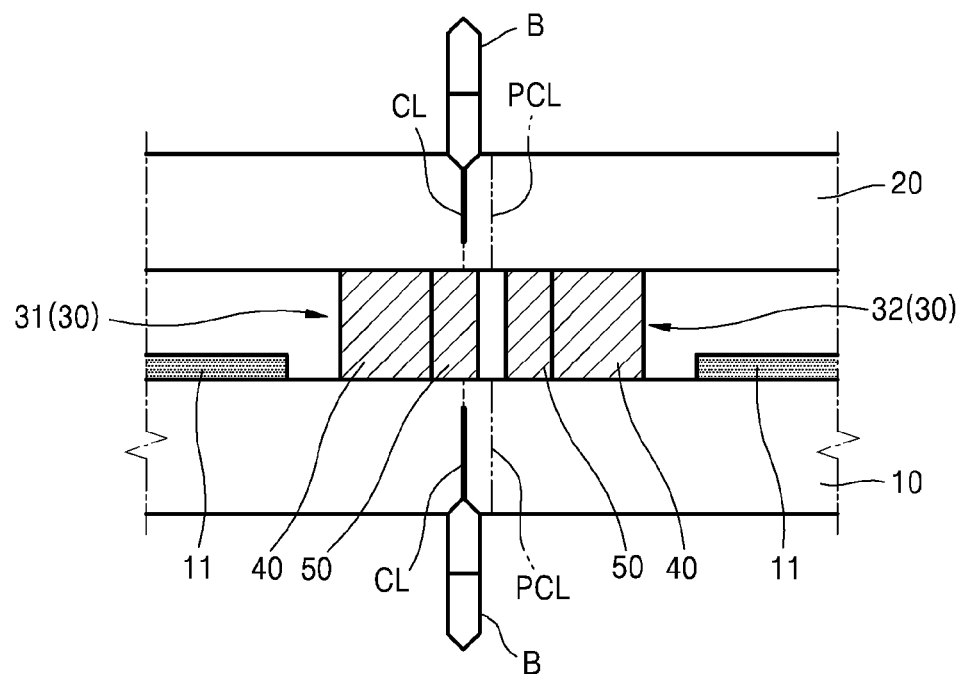
FIGS. 4A and 4B are cross-sectional views that schematically illustrate when cutting lines are off planned cutting lines.
Figure 4B:
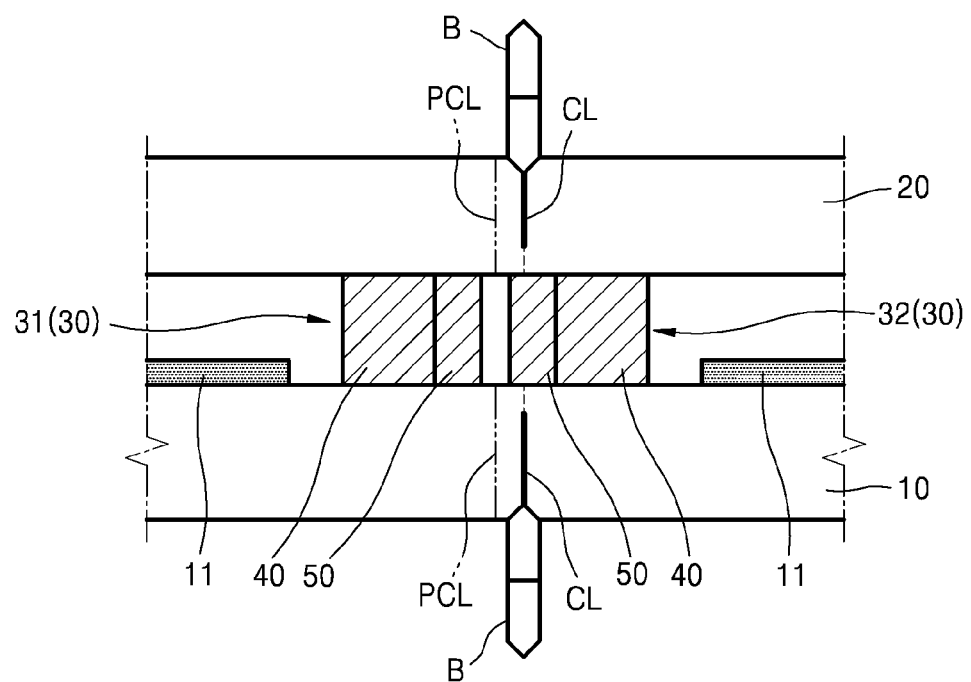
Figure 5A:
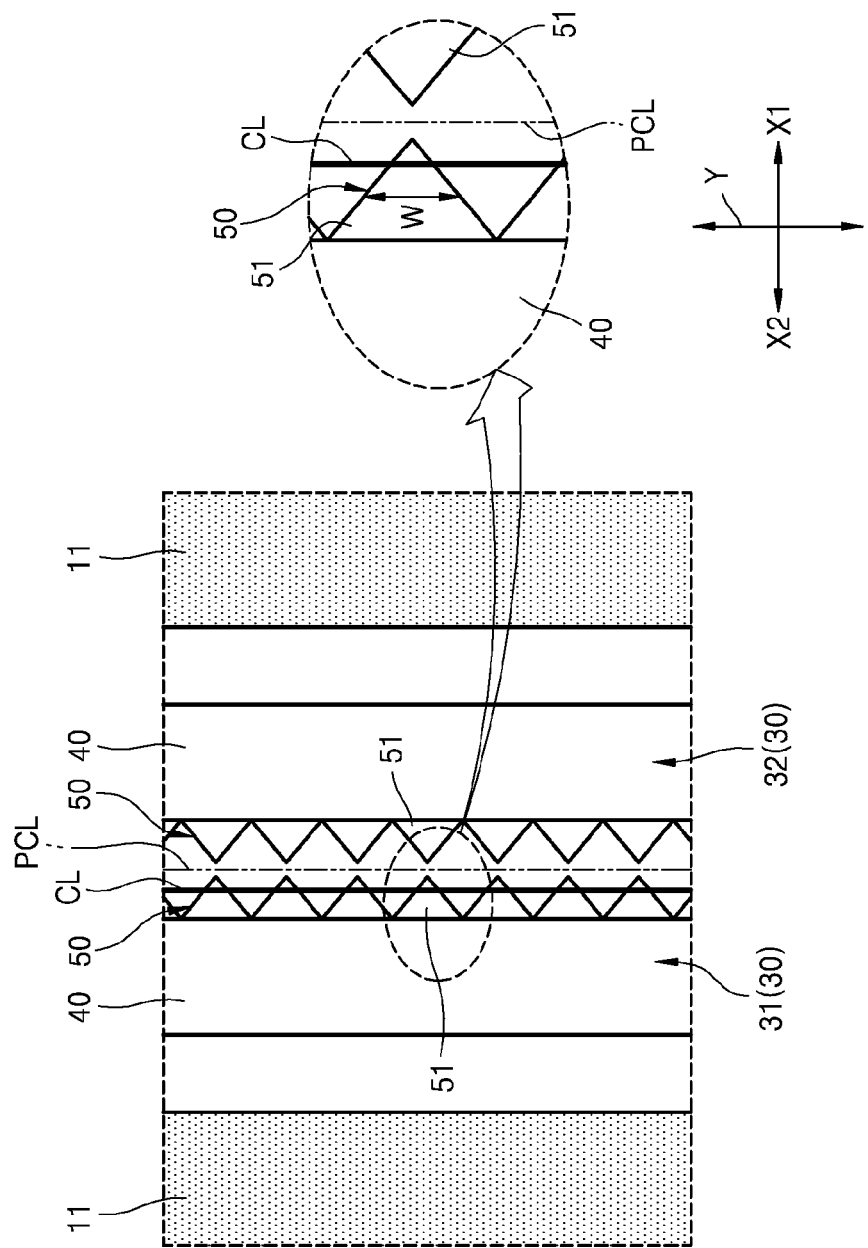

FIGS. 4A and 4B are exemplary cross-sectional views that schematically illustrate when the CLs do not match the PCLs, and FIGS. 5A and 5B are plan views that schematically illustrate a portion of the mother panel 1 when the CLs do not match the PCLs as in FIGS. 4A and 4B.

The CLs by the blades B may be off formed to the left of the PCLs, and thus, overlap the second sealing member 50 as in FIG. 4A, or may be formed to the right of the PCLs to overlap the second sealing member 50 as in FIG. 4B.

Referring to FIGS. 5A and 5B, the CL may not align with the PCL, and thus, may overlap with a portion of the unit patterns 51 of the second sealing member 50.

The unit patterns 51 of the second sealing member 50 have a structure in which the width W in the second direction Y becomes narrow as the unit patterns 51 become closer to the PCL. Accordingly, even when the CL is formed off from the PCL, the width at which the CL overlaps the second sealing member 50 may be minimized. Thus, a normal cutting where the first and second mother substrates 10 and 20 are cut in a shape of the CL becomes possible.

Unless the unit patterns 51 are of the structure in which the width W decreases along the first direction X1, for example, if the unit patterns 51 are of a structure in which the width W is constant, the width at which the CL overlaps the second sealing member 50 in the first and second substrates 110 and 120 will appear constant. The width at which the CL overlaps the second sealing member 50 will appear constant regardless of the distance the CL is apart from the PCL. Accordingly, if the width W in the second direction Y of the second sealing member 50 is widened to increase the bonding strength, the cutting error is more likely to occur because the width at which the CL and the second sealing member 50 overlap proportionally increases. On the contrary, if the width W of the second sealing member 50 is narrowed to prevent the cutting error, the effect of improving the bonding strength correspondingly reduces.

However, the present embodiment may have at least two effects, which are improving a bonding strength and preventing a cutting error at the same time, by having the unit patterns 51's width W decreasing toward the first direction X1.

Referring to FIG. 2A again, the second sealing member 50 may have a saw-tooth like cross-sectional shape in a direction parallel to the first mother substrate 10. The unit patterns 51 of the second sealing member 50's width W may linearly decrease in the second direction Y as the unit patterns 51 get closer to the PCL. As an example in which the unit patterns 51 of the second sealing member 50 have the width W decreasing linearly, the unit patterns 51 may have a cross-sectional shape in the direction parallel to the first mother substrate 10 which is triangle-shaped. The triangles may be, for example, right-angled triangles or isosceles triangles besides equilateral triangles as shown in FIG. 2A. As another example in which the unit patterns 51 of the second sealing member 50 have the width W decreasing linearly, unit patterns 51$a$ may have a cross-sectional shape in the direction parallel to the first mother substrate 10 which is trapezoid-shaped (frusto-triangular) as in FIG. 6.

Alternately, the unit patterns 51 of the second sealing member 50 may have the width W in the second direction Y decreasing non-linearly. By way of illustration, unit patterns 51$b$ or 51$c$ may have cross-sectional shapes in the direction parallel to the first mother substrate 10 which are of a wave form shapes as in FIGS. 7A and 7B. For example, the unit patterns 51$b$ or 51$c$ may be semicircular or parabolic.

Referring to FIG. 2A, the second sealing member 50 may be formed to contact the first sealing member 40. The second sealing member 50 and the first sealing member 40 may be formed in one. Thus, the first sealing member 40 and the second sealing member 50 may be formed simultaneously, and the gap g1 between the first sealing member 40 and the PCL may be minimized. However, a disposition of the second sealing member 50 is not limited thereto, and the second sealing member 50 may be formed to be separate from the first sealing member 40, which is not shown by way of illustration in the diagram.

The first sealing portion 31 and the second sealing portion 32 which are adjacent include the second sealing members 50 which are adjacent to each other with the PCL interposed there between. An end portion of the unit patterns 51 of the second sealing member 50 may be disposed to face the end portion of the unit patterns 51 of the adjacent second sealing member 50. Here, the end portion of the unit patterns 51 of the second sealing member 50 may have the same location in the second direction Y as the end portion of the unit patterns 51 of the adjacent second sealing member 50.

Figure 8:
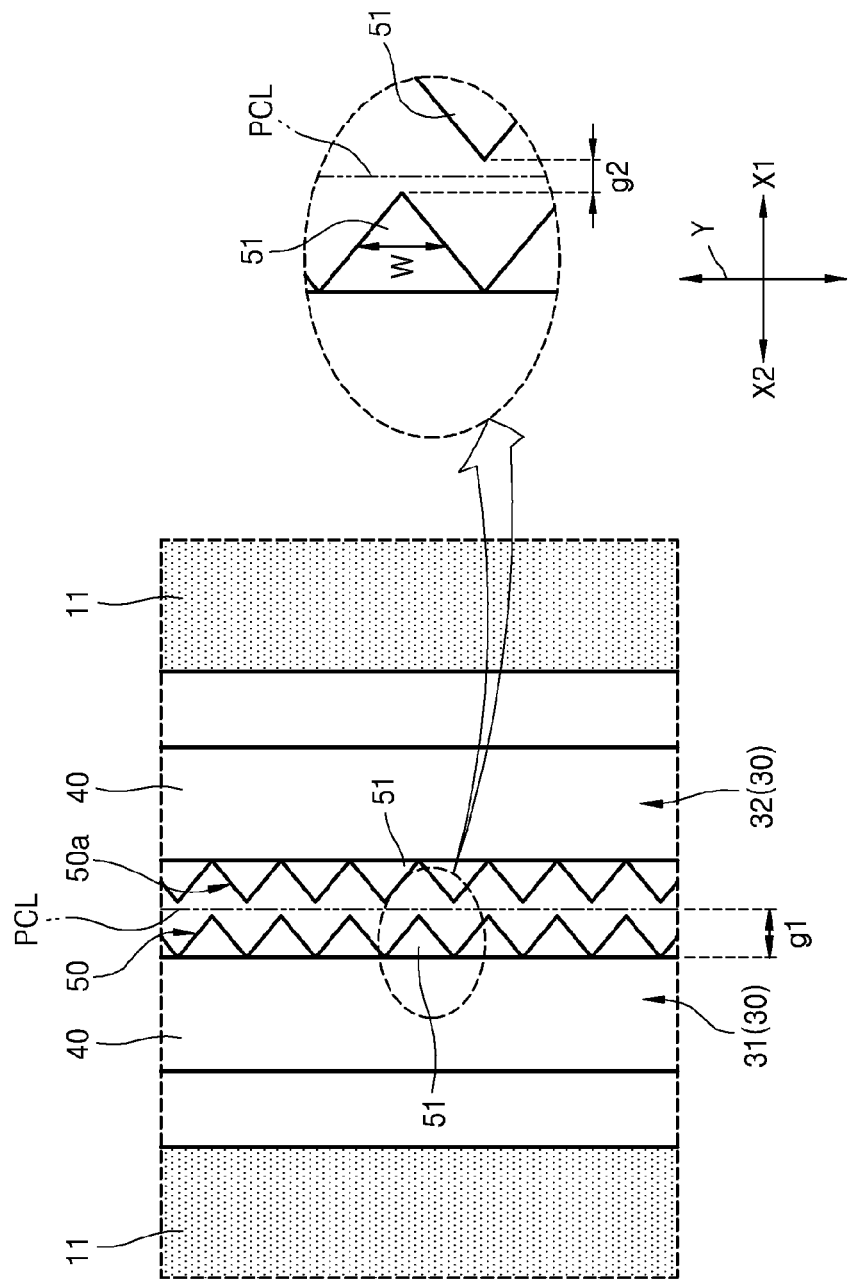

Alternately, the end portion of the unit patterns 51 of the second sealing member 50 may be disposed not facing the end portion of the unit patterns 51 of an adjacent second sealing member 50a as in FIG. 8. Here, the end portion of the unit patterns 51 of the second sealing member 50 may have a different location toward the second direction Y from the end portion of the unit patterns 51 of the adjacent second sealing member 50a.

A separation gap g2 between the end portion of the unit patterns 51 of the second sealing member 50 and the end portion of the unit patterns 51 of the adjacent second sealing member 50 may range from approximately 10 um to 30 um.

Figure 9:
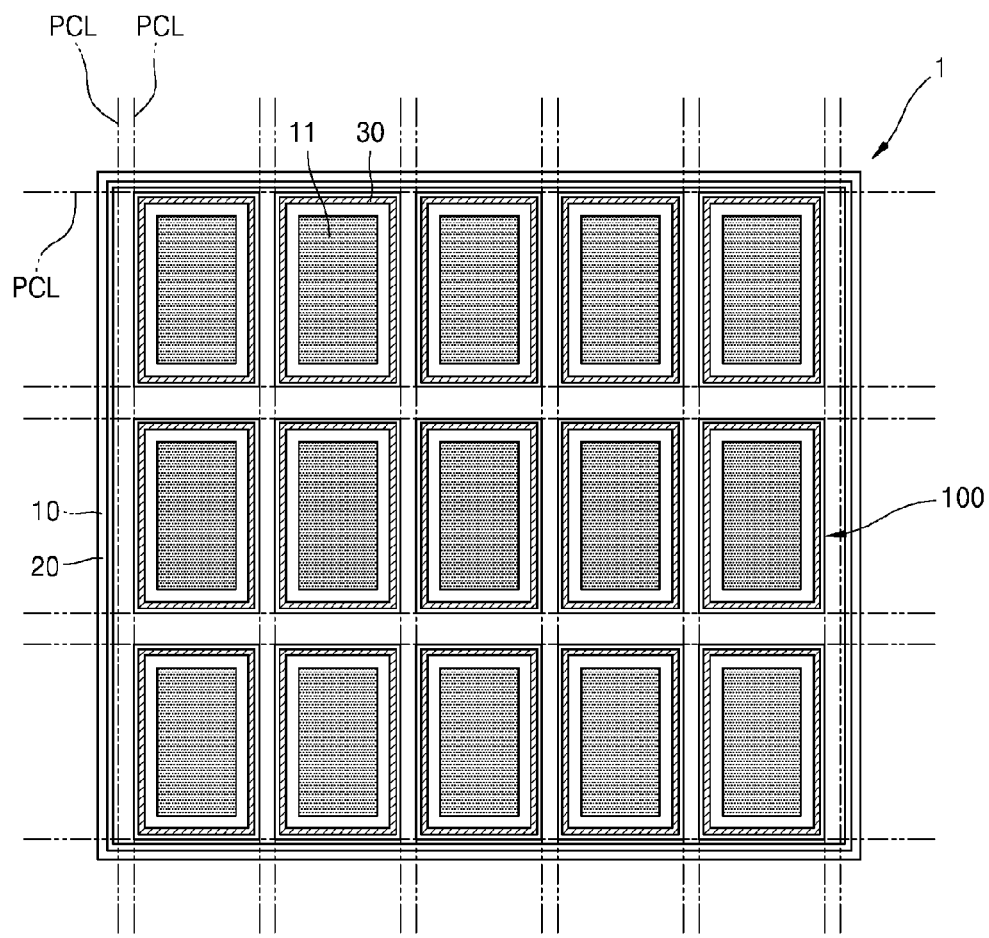
FIG. 9 is a schematic plan view of a mother panel according to an exemplary embodiment of the present invention.

The above embodiments have been explained with focus on an example in which spaces between cells which are adjacent from side to side are cut once and spaces between cells which are adjacent above and below are cut twice. However, the cutting times may vary depending on needs. For example, the spaces of cells which are adjacent from side to side may be cut twice and the spaces of cells which are adjacent above and below may be cut twice as in FIG. 9.

Figure 10A:
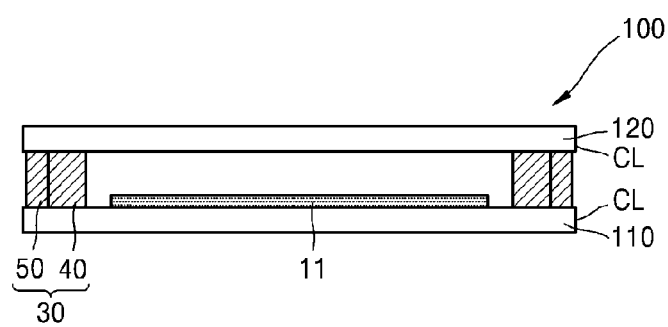
FIGS. 10A and 10B are a cross-sectional view and a plan view of a display panel according to an exemplary embodiment of the present invention.
Figure 10B:
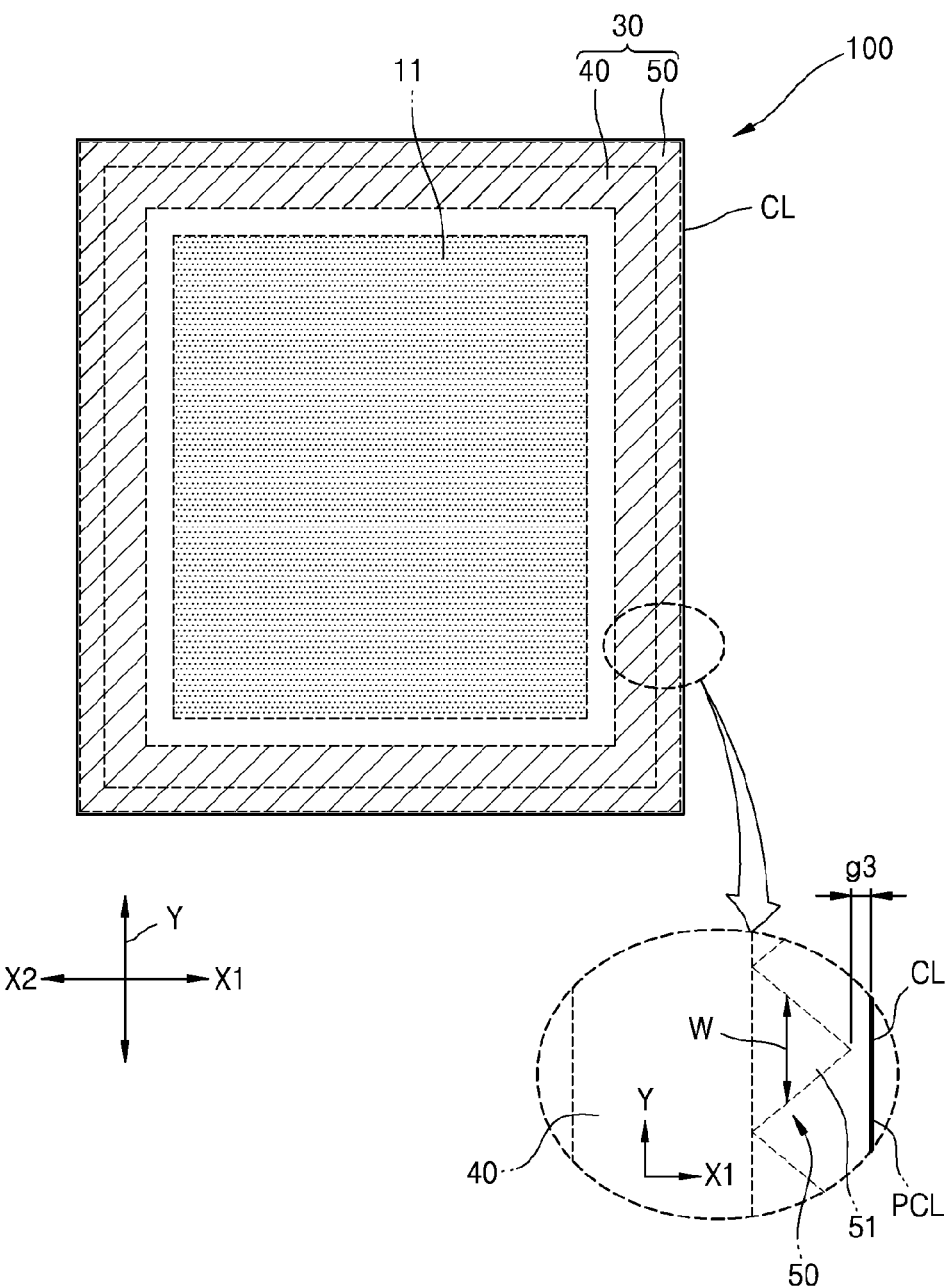

FIGS. 10A and 10B are a cross-sectional view and a plan view of a display panel 100 according to an exemplary embodiment of the present invention. FIGS. 10A and 10B show an example of the display panel 100 separated from the above mother panel 1.

Referring to FIGS. 10A and 10B, the display panel 100 includes a first substrate 110, a second substrate 120 which is disposed to face the first substrate 110, and a sealing portion 30 which is disposed between the first substrate 110 and the second substrate 120 to bond the first substrate 110 and the second substrate 120.

The first substrate 110 may be made of various materials. For example, the first substrate 110 may be a glass substrate, a metal substrate, or a plastic substrate with flexibility. At least one of end portions of the first substrate 110 may be a CL cut by the above cutting process.

A display device 11 is disposed on the first substrate 110. The display device 11 may be an OLED. The OLED may include an anode, a cathode, and an emission layer between the anode and the cathode. A display device 11 according to exemplary embodiments of the present invention may also be a liquid crystal display device or an electrophoretic display device.

The second substrate 120 may be made of a transparent member. An image embodied in the display device 11 may be exposed outside by the transparent second substrate 120. The second substrate 120 may be a glass substrate. In exemplary embodiments of the present invention, the second substrate 120 may further include an on-cell touch screen panel where a touch screen pattern is formed so as to play a role of a touch panel. At least one of the end portions of the second substrate 120 may be the CL cut by the above cutting process.

The sealing portion 30 is disposed to surround the display device 11 between the first substrate 110 and the second substrate 120 and forms a closed loop. The sealing portion 30 bonds the first substrate 110 and the second substrate 120 to seal the inner space between the first substrate 110 and the second substrate 120. A moisture absorbent or a filler may be located in the inner space between the first substrate 110 and the second substrate 120.

The sealing portion 30 may include an inorganic compound. For example, the sealing portion 30 may include a glass frit. The first substrate 110 and the second substrate 120 may be stably bonded and sealed by irradiating a laser beam on the sealing portion 30 and melting (or firing) and hardening the sealing portion 30 accordingly.

The sealing portion 30 includes a first sealing member 40, and a second sealing member 50 which is disposed at an outside of the first sealing member 40.

The first sealing member 40 is disposed to surround the display device 11 between the first substrate 110 and the second substrate 120 and forms a closed loop.

The second sealing member 50, along with the first sealing member 40, bonds the first substrate 110 and the second substrate 120. The second sealing member 50 may improve a bonding property between the first and second substrates 110 and 120 by increasing contact areas between the first and second substrates 110 and 120 and the sealing portion 30.

The second sealing member 50 may have a plurality of unit patterns 51. Along a first direction X1 which is a direction away from the first sealing member 40, each of the unit patterns 51 has a decreasing width W in a second direction Y which is perpendicular to the first direction X1. The unit patterns 51 may be arranged along the second direction Y.

Figure 6:
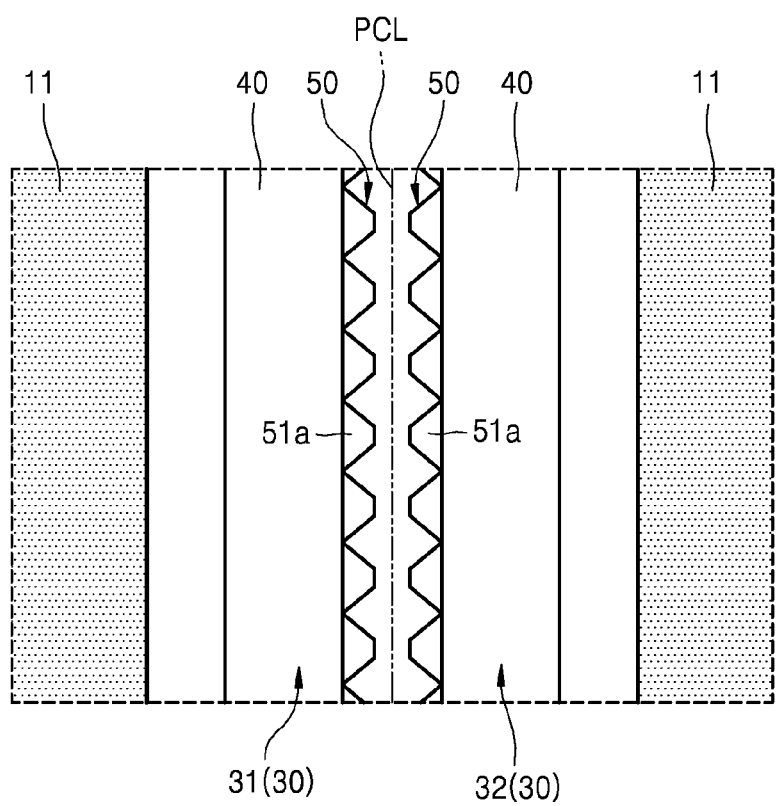
FIGS. 6, 7A, 7B, and 8 are views that illustrate transformation examples of unit patterns of second sealing members which are shown in FIG. 2B.

The second sealing member 50 may have a sawtooth-like cross-sectional shape in a direction parallel to the first substrate 110. The unit patterns 51 of the second sealing member 50's width W may linearly decrease in the second direction Y. As an example in which the unit patterns 51 of the second sealing member 50 have the width W decreasing linearly, the unit patterns 51 may have a cross-sectional shape in the direction parallel to the first substrate 110 which is triangle-shaped. The triangles may be, for example, right-angled triangles or isosceles triangles besides equilateral triangles shown in FIG. 2A. As another example in which the unit patterns 51 of the second sealing member 50 have the width W decreasing linearly, the unit patterns 51 may have a cross-sectional shape in the direction parallel to the first substrate 110 which are trapezoid-shaped as shown in FIG. 6.

Figure 7A:
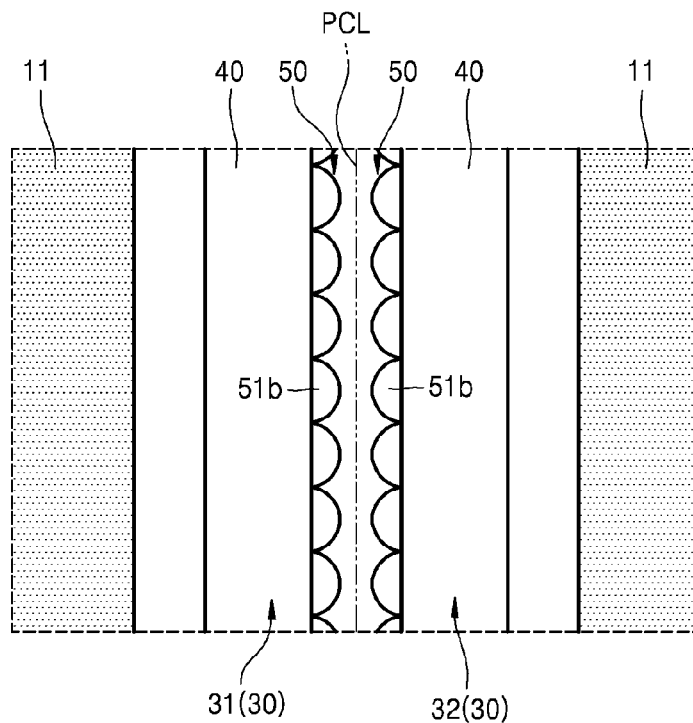
Figure 7B:
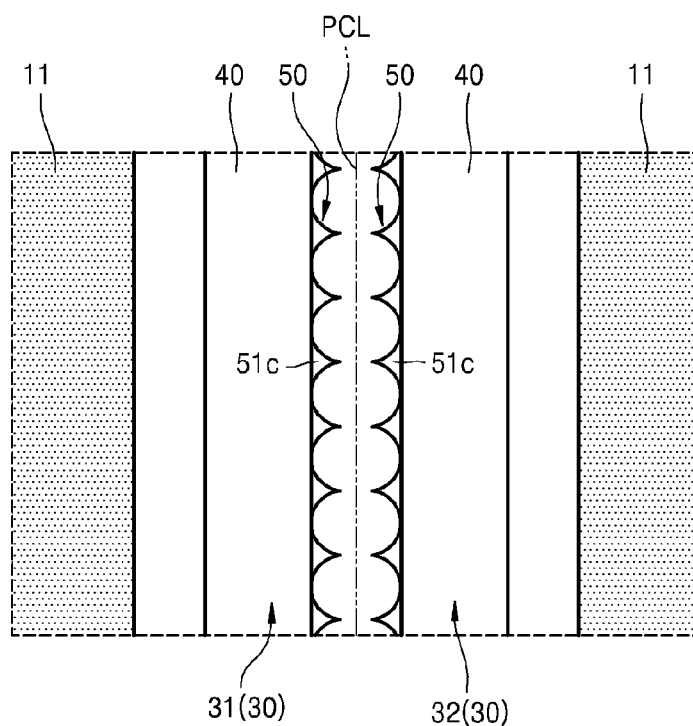

Alternately, the unit patterns 51 of the second sealing member 50 may have the W in the second direction Y decreasing non-linearly. By way of illustration, the unit patterns 51 may have a cross-sectional shape in the direction parallel to the first substrate 110 which is of a wave shape as shown in FIGS. 7A and 7B.

Meanwhile, a shape of the second sealing member 50 may vary depending on a cutting process.

As an example of the shape of the second sealing member 50, if the CL is formed along a PCL, the unit patterns 51 of the second sealing member 50 shown on the display panel 100 may have the same shape as the unit patterns 51 of the second sealing member 50 shown on the mother panel 1 because the CL does not overlap the second sealing member 50. Accordingly, the second sealing member 50 of the display panel 100 is disposed in which an end portion of the unit patterns 51 and the CL which is the end portion of the first substrate 110 have a separated location in the first direction X1. For example, a separated gap g3 (FIG. 10B) in the first direction X1 between the end portion of the unit patterns 51 in the first direction and the CL which is the end portion of the first substrate 110 may be equal to or less than about 30 um.

Figure 11A:
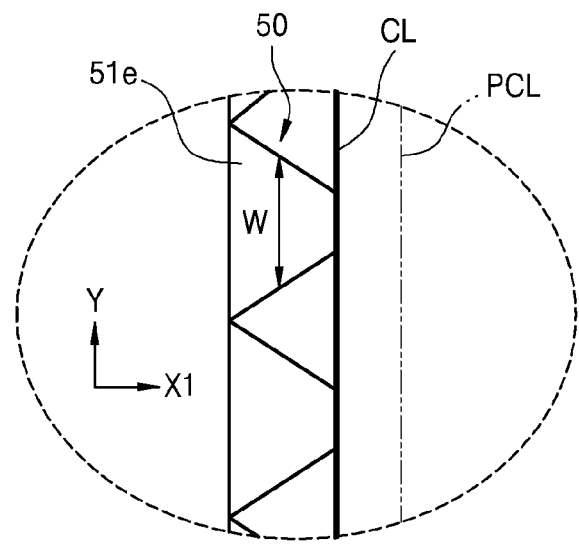
FIGS. 11A and 11B are plan views that enlarge and illustrate a portion of a display panel according to exemplary embodiments of the present invention.
Figure 11B:
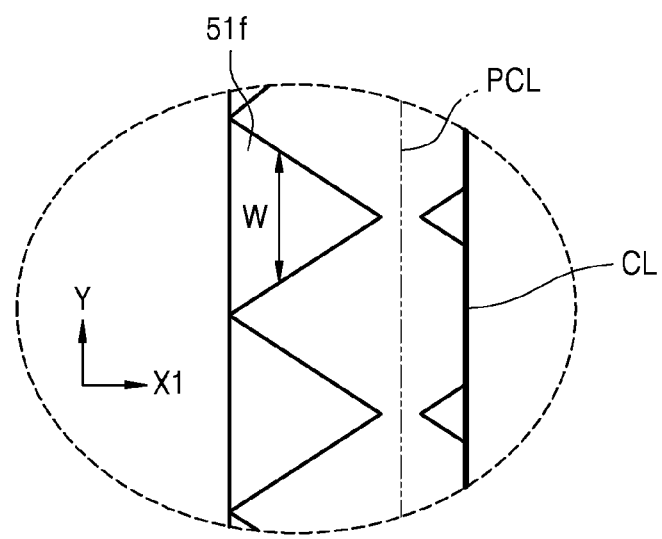

As shown in FIG. 11A, as another example of the shape of the second sealing member 50, if the CL is formed off the PCL, unit patterns 51e of the second sealing member 50 shown on the display panel 100 may have a different shape from the unit patterns 51 of the second sealing member 50 shown on the mother panel 1 because the CL overlaps at a portion of the second sealing member 50. This is due to a portion of the unit patterns 51 of the second sealing member 50 shown on the mother panel 1 being cut. Accordingly, although the shape of the unit patterns 51 shown on the mother panel 1 are triangles, the shape of the unit patterns 51e or 51f shown on the display panel 100 cut from the mother panel 1 may be in a shape of trapezoids as in FIG. 11A or in a shape of triangles with smaller triangles added thereto as in FIG. 11B. The second sealing portion 50 may be disposed so the end portion of unit patterns 51e or 51f and the end portion of the first substrate 110 have the same location in the first direction.

The second sealing member 50 may be formed to contact the first sealing member 40. The second sealing member 50 and the first sealing member 40 may be formed in one. However, a disposition of the second sealing member 50 is not limited thereto, and the second sealing member 50 may be formed to be separate from the first sealing member 40.

As described above, according to one or more embodiments of the present invention, a display panel and a mother panel for manufacturing the same may improve bonding performance of a sealing portion and prevent a cutting error in a cutting process by forming a second sealing member which has unit patterns whose width decreases as the unit patterns get further apart from a first sealing member at an outer side of the first sealing member which surrounds a display device.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A mother panel comprising:
   a first mother substrate;
   a second mother substrate facing the first mother substrate;
   display devices disposed between the first mother substrate and the second mother substrate, the display devices being separated from each other;
   first sealing members disposed between the first mother substrate and the second mother substrate and surrounding each of the display devices; and
   second sealing members disposed between the first mother substrate and the second mother substrate and disposed on the outer side of the first sealing members, the second sealing members comprising unit patterns,
   wherein a width of each unit pattern in a second direction perpendicular to a first direction decreases along the first direction which is a direction away from each of the first sealing members and parallel to the first and second mother substrates, and
   wherein the unit patterns are arranged along the second direction.

2. The mother panel of claim 1, wherein the widths in the second direction of the unit patterns decrease linearly along the first direction.

3. The mother panel of claim 1, wherein the second sealing members have a saw-tooth cross-sectional shape in a direction parallel to the plane of the first mother substrate.

4. The mother panel of claim 1, wherein the unit patterns have triangular cross-sectional shapes in a direction parallel to the plane of the first mother substrate.

5. The mother panel of claim 1, wherein ends of the unit patterns of adjacent second sealing members point to one another.

6. The mother panel of claim 1, wherein ends of the unit patterns of adjacent second sealing members point between one another.

7. The mother panel of claim 6, wherein a minimum distance between unit patterns of adjacent second sealing members ranges from about 10 um to about 30 um.

8. The mother panel of claim 5, wherein a minimum distance between unit patterns of adjacent second sealing members ranges from about 10 um to about 30 um.

9. The mother panel of claim 1, wherein the first sealing members and the second sealing members comprise glass frits.

10. A display panel comprising:
    a first substrate;
    a second substrate facing the first substrate;
    a display device disposed between the first substrate and the second substrate;
    a first sealing member disposed between the first substrate and the second substrate surrounding the display device; and
    a second sealing member disposed between the first substrate and the second substrate and disposed on the outer side of the first sealing member, the second sealing member comprising unit patterns,
    wherein a width of each unit pattern in a second direction perpendicular to a first direction decreases along the first direction which is a direction away from the first sealing member and parallel to the first and second mother substrates, and
    wherein the unit patterns are arranged along the second direction.

11. The display panel of claim 10, wherein the widths in the second direction of the unit patterns decrease linearly along the first direction.

12. The display panel of claim 10, wherein the second sealing members have a saw-tooth like cross-sectional shape in a direction parallel to the plane of the first substrate.

13. The display panel of claim 10, wherein the unit patterns have trapezoidal cross-sectional shapes in a direction parallel to the plane of the first substrate.

14. The display panel of claim 10, wherein the second sealing member is disposed in which an end portion of the unit patterns and an end portion of the first substrate have the same location in the first direction.

15. The display panel of claim 10, wherein the second sealing member is disposed in which an end portion of the unit patterns and an end portion of the first substrate have a separated location within a range of 30 um in the first direction.

16. The display panel of claim 10, wherein the first sealing member and the second sealing member comprise glass frits.

* * * * *